United States Patent
Gibson, Jr.

(10) Patent No.: US 7,632,690 B2
(45) Date of Patent: Dec. 15, 2009

(54) REAL-TIME GATE ETCH CRITICAL DIMENSION CONTROL BY OXYGEN MONITORING

(75) Inventor: Gerald W. Gibson, Jr., Danbury, CT (US)

(73) Assignee: Agere Systems Inc., Allentown, PA (US)

( * ) Notice: Subject to any disclaimer, the term of this patent is extended or adjusted under 35 U.S.C. 154(b) by 186 days.

(21) Appl. No.: 11/827,807

(22) Filed: Jul. 13, 2007

(65) Prior Publication Data
US 2007/0275485 A1      Nov. 29, 2007

Related U.S. Application Data

(62) Division of application No. 10/675,572, filed on Sep. 30, 2003, now Pat. No. 7,261,745.

(51) Int. Cl.
*H01L 21/00* (2006.01)

(52) U.S. Cl. .............................. 438/9; 438/760; 216/60
(58) Field of Classification Search .................... 438/9, 438/760; 216/60
See application file for complete search history.

(56) References Cited

U.S. PATENT DOCUMENTS

| | | | | |
|---|---|---|---|---|
| 5,500,076 | A * | 3/1996 | Jerbic | 438/9 |
| 5,702,562 | A * | 12/1997 | Wakahara | 216/60 |
| 6,245,581 | B1 * | 6/2001 | Bonser et al. | 438/8 |
| 6,368,879 | B1 * | 4/2002 | Toprac | 438/5 |
| 6,461,878 | B1 * | 10/2002 | Lansford | 438/14 |

* cited by examiner

*Primary Examiner*—Fernando L Toledo

(57) ABSTRACT

A process and apparatus for controlling an etchant gas concentration in an etch chamber. The etchant gas concentration and an inert gas concentration are determined and the latter concentration is used to normalize the etchant gas concentration. The normalized value is compared with a predetermined reference value and the flow of etchant gas into the chamber is controlled in response thereto.

20 Claims, 2 Drawing Sheets

REAL-TIME GATE ETCH CRITICAL DIMENSION CONTROL BY OXYGEN MONITORING

This application is a divisional of prior application Ser. No. 10/675,572 filed Sep. 30, 2003 now U.S. Pat. No. 7,261,745, which is incorporated herein by reference.

FIELD OF THE INVENTION

The present invention relates generally to controlling critical dimensions of a semiconductor device, and more particularly to trimming a conductor line width, such as the gate line width, using a controllable trim rate.

BACKGROUND OF THE INVENTION

Semiconductor devices typically comprise a substrate and elements such as transistors formed from doped regions within the substrate. Interconnect layers are formed overlying the semiconductor substrate to electrically interconnect the devices and to provide a connection pad for connection to external circuit elements.

The interconnect layers are formed by employing conventional photolithographic techniques, wherein a pattern is designed on a photomask and transferred to the semiconductor chip via exposure and etching processes. A relatively thin layer of photoresist material is deposited on the substrate and exposed to a controlled pattern of radiation, causing a chemical reaction in the exposed regions. Visible light, ultraviolet radiation, electron beam or x-ray energy can be used as the developing energy depending upon the selected photoresist material. A developer solution contacts the photoresist layer to dissolve and remove either the radiation exposed areas or the radiation masked areas, depending upon the chemistry of the selected photoresist material. If the exposed areas of the photoresist layer become less soluble after exposure, the pattern remaining on the substrate is a negative image of the radiation pattern and the photoresist is referred to as a negative photoresist. If the exposed area becomes more soluble and is removed by the developer solution, the pattern remaining on the substrate is a positive image of the pattern of radiation and the photoresist is referred to as a positive-acting photoresist. In either case, when the photoresist is removed a desired region of the underlying substrate is uncovered for exposure to subsequent processing steps. The region of the substrate where the photoresist mask remains in place is protected from the subsequent processing steps. Subsequent processing steps include implanting dopants, depositing materials and applying an etchants to the surface to remove the exposed material.

Continuing advancements in semiconductor technology have promoted the fabrication of smaller devices operating at higher speeds. The drive towards such ultra large-scale integration has resulted in continued shrinking of device sizes, circuit dimensions and device features, resulting in the use of smaller masks during the photolithographic process. However, when transferring the mask pattern to the substrate, the critical dimensions of the pattern are restricted to the resolution limit of the optical exposure tool that exposes the pattern. For example, for integrated circuits comprising field-effect transistors, an important process step is the formation of the transistor gate, with particular emphasis on the dimensions of the gate. In many applications, the performance characteristics (e.g., switching speed) and the size of the transistor are functionally related to the transistor channel length, which corresponds approximately to the width of the transistor gate. Shorter channel lengths tend to produce higher performance transistors (within certain limits).

Gate line width control is thus of paramount importance in semiconductor manufacturing. As semiconductor operational speeds increase and dimensions decrease, certain techniques have been developed for forming aggressively small gate line width targets in advanced fabrication technologies. One known technique photolithographically defines the gate structure with a size somewhat larger than the final target. The gate-defining photoresist material is over-sized during the conventional photolithographic masking and patterning processes. In a subsequent etching step the photoresist is reduced in both the length and the width dimensions by exposure to an oxygen radical. Subsequent etching of the underlying conductive layer to form the gate results in a narrower gate length and width than defined by the mask dimensions.

As illustrated in FIG. 1, a conductive layer 10, comprising for example polysilicon or a conductive metal, is formed on a semiconductor substrate 12. An anti-reflective coating layer 14 overlies the conductive layer 10. Photoresist patterns 16 are formed by conventional photolithographic techniques as described above. The height (h), width (w) and spacing (s) of the photoresist patterns 16 are illustrated in FIG. 1.

In a conventional plasma etching chamber the substrate is subjected to an oxygen gas containing oxygen radicals that thin the photoresist patterns, with the resulting photoresist profile illustrated in FIG. 2, where h' is less than h, w' is less than w and s' is less than s. Typically, the process is carried out at atmospheric pressure and at a relatively low temperature of between about 130° C. and 200° C. The photoresist material comprises a basic C—H—O structure that may be easily disconnected through reaction with the oxygen radical, forming $CO_2$, $CO$ and $H_2O$, which are then exhausted from the process chamber.

One disadvantage of this prior art trim process is the inability to determine a process end point such that the plasma etch of the photoresist can be terminated when the end point is reached. Unlike most conventional semiconductor etch processes, the trim process does not end or terminate on an etch stop layer. When applied to the process of gate etch, the lack of a definitive end point leads to variations in the gate dimensions that can affect several performance parameters, including device speed and current leakage. The variations in the trim process can also reduce throughput, yield, and profitability if one or more of the gate dimensions are reduced beyond predetermined limits.

In an effort to overcome these disadvantages, certain statistical process control or wafer-run monitoring ("run-to-run" control) techniques have been applied to the trim tool. In either case, external metrology tools, such as a critical dimension scanning electron microscope or a scatterometer, are employed to measure the gate dimensions and control the etch trim process based on the measurement results. These measurements can be performed in situ on the fabricated gate or ex situ on the photoresist layer. However, this process control technique benefits only subsequently fabricated transistors. No real-time feedback control is provided, possibly resulting in the fabrication of defective wafers during the period between determining that a critical dimension problem exists and adjusting the process variables to overcome the problem. Further, the process adjustments are applied iteratively in an effort to alleviate the problem, as the root cause is frequently not known. Without a root cause determination, the variable adjustments may offer only a temporary fix or may not produce an immediate fix as the process is iterated toward the correct parameters. Additionally, as the chamber conditions change over time, the initial process adjustments will likely no longer be adequate.

Various process control techniques are conventionally employed to determine whether a semiconductor fabrication process tool is functioning properly. Statistical process control techniques can be utilized to identify long term statistical variations in one or more specific critical dimensions of a device. A critical dimension of interest is measured on several devices or fields within a wafer on a predetermined schedule. Based on several wafer lots, a statistical function, such as an average or a standard deviation of the measured critical dimension is calculated. As processing continues, additional fields are randomly selected from processed devices, the critical dimensions measured, and the running average or standard deviation recalculated using the latest critical dimension measurement. If the last acquired measurement does not change the average or standard deviation by more than a predetermined amount, then the process is deemed to be repeatable and no process modifications are required. If the last measurement causes the average or standard deviation to change by more than the predetermined amount then a change to the process "recipe" is warranted. Recipe changes include modifying any of the variables associated with the process tool that is causing the out-of-range feature. For example, gas pressure and/or temperature can be raised or lowered, the quantity of inlet gas per unit time can be increased or decreased, and various voltage settings can be modified in an effort to return the feature size to pre-established limits. Although this method can be used to provide a statistical analysis of a critical dimension, it cannot identify the root cause of critical dimension variations.

Run-to-run control of feature dimensions also requires the use of external metrology tools. After processing each cassette of wafers (typically 25 wafers) a plurality of critical dimensions are measured. If found to be out-of-specification, the process variables are examined in an effort to determine the cause of the anomaly and the process recipe modified in response thereto.

Although the statistical process control and run-to-run control techniques provide some feature size information for controlling a fabrication process, such as the trim rate process described above, they may not provide the desired repeatability for critical dimension control. Nor do they provide real time control over the etch rate, as the critical measurements are performed off-line and modifications are made only after confirming an out-of-specification condition.

It has been determined that the lateral etch rate for the above-described resist trim process depends on such parameters as the photolithographic pattern density, the wafer mix previously processed through the etching chamber and the cleanliness state of the chamber, i.e., the number of wafers that have been etched since the last chamber cleaning. It is believed that these factors, and likely others, influence the concentration of the available etching oxidant, in turn altering the rate at which the trim etch proceeds. According to the prior art techniques, if the statistical process control methods or run-to-run measurements indicate that the trim results are not within the predetermined bounds the flow of oxidizing gas is varied to attempt a process correction.

Certain techniques are known for controlling the trim process and attempting to reduce process variations. For example, process-specific (or tool or chamber-specific) and product-specific recipes can be devised. Thus when fabricating a certain product, the product-specific recipe for that product is employed in an effort to limit variations in the trim rate and produce a more consistent result. Similarly, when trim etching a product in a specific tool or chamber, the only the unique recipe associated with that chamber is employed. Given their different process histories and inherent physical differences, two chambers rarely employ the same recipe to fabricate the same product. Recipes can also be developed for wafers having specific photolithographic pattern densities. Observed long-term drift of the trim results, as determined by statistical process control techniques described above, can be mitigated by adjustment of the oxidant flow for all chamber-based and product-based recipes.

Whenever a new product is introduced into the manufacturing process it is preferable to monitor the trim etch results until a statistical database is created or until the effects of the trim process variables on the product is obtained. It is also important to verify the trim rate after each major etch tool hardware perturbation, such as when the chamber is cleaned.

As can be inferred from the foregoing discussion, given the significant number of variables affecting it, the trim process is cumbersome, not repeatable, and not easily controlled. Under certain worst-case conditions the process may not be usable in a manufacturing environment.

BRIEF SUMMARY OF THE INVENTION

A process for controlling an etch rate on a semiconductor substrate wherein the etch rate is substantially affected by the concentration of an etchant gas. The etchant gas is input to an etch chamber via a mass flow controller. The etchant gas concentration in the chamber is determined and compared with a target concentration. An error signal is generated in response thereto for controlling the mass flow controller to maintain the desired chamber gas concentration.

BRIEF DESCRIPTION OF THE DRAWINGS

The foregoing and other features of the invention will be apparent from the following more particular description of the invention, as illustrated in the accompanying drawings in which like reference characters refer to the same parts throughout the different figures. The drawings are not necessarily to scale, emphasis instead being placed upon illustrating the principles of the invention.

DETAILED DESCRIPTION OF THE INVENTION

Figure 1:
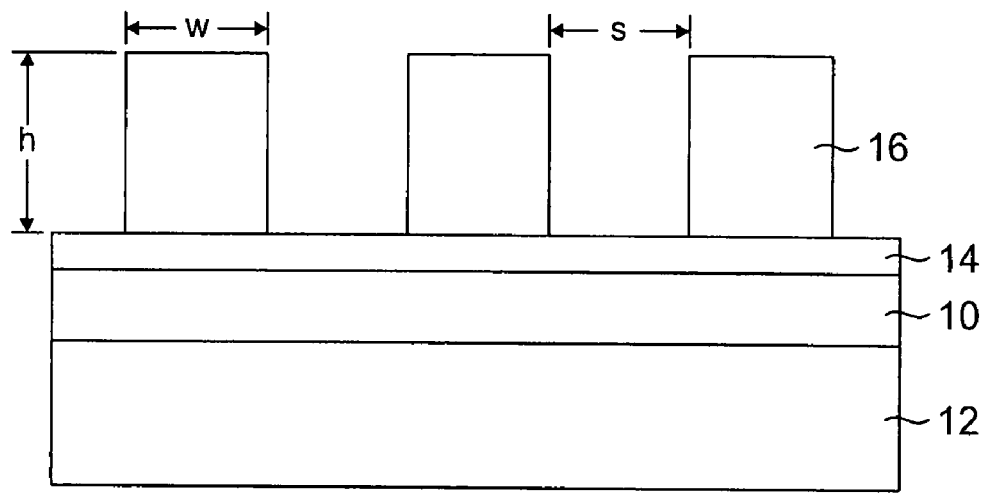
FIGS. 1 and 2 are cross sectional views illustrating prior art line width trimming processes.
Figure 2:
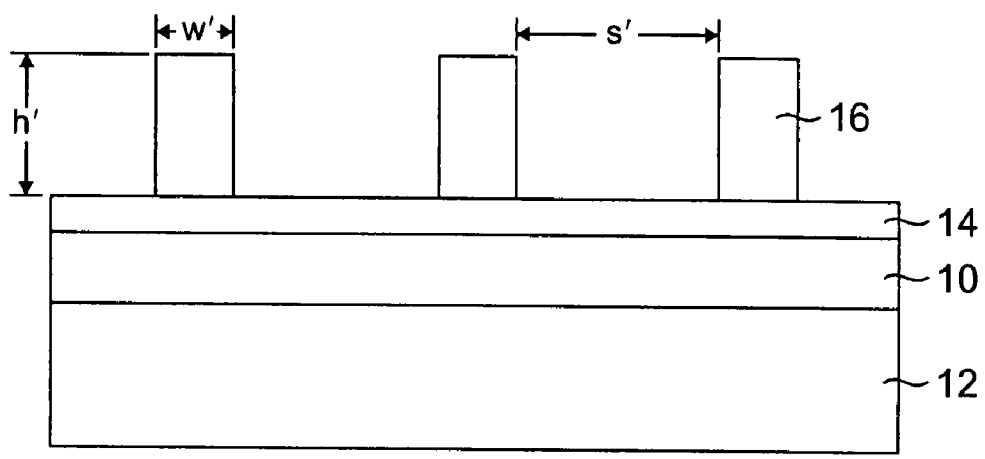

Before describing in detail the particular critical dimension etch process and apparatus in accordance with the present invention, it should be observed that the present invention resides primarily in a novel combination of elements and process steps. Accordingly, the elements have been represented by conventional elements in the drawings, showing only those specific details that are pertinent to the present invention so as not to obscure the disclosure with structural details that will be readily apparent to those skilled in the art having the benefit of the description herein.

To overcome certain disadvantages of the prior art etch trim process, the present invention provides real-time monitoring of the oxygen radical concentration in the etch chamber plasma, as this variable is a major factor in determining the trim etch rate. The oxygen radical comprises an $O_2$ molecule that has been disassociated into two oxygen atoms. It is known that this concentration can be affected by photolithographic pattern density and chamber hardware conditions such as the chamber wall condition. By monitoring the oxygen radical concentration in real time during the etch trim process and providing a feedback signal to the oxygen mass flow controller, the oxygen flow rate is controlled to hold the concentration substantially constant. With a controlled oxygen radical concentration and thus a stable etch trim rate during successive run-to-run etch steps, the gate trim process is rendered stable and repeatable. The appropriate trim duration is easily determinable once the trim rate is known and stable. There are various known methods for determining the oxygen atom concentration in a chamber, one such method is described below.

Figure 3:
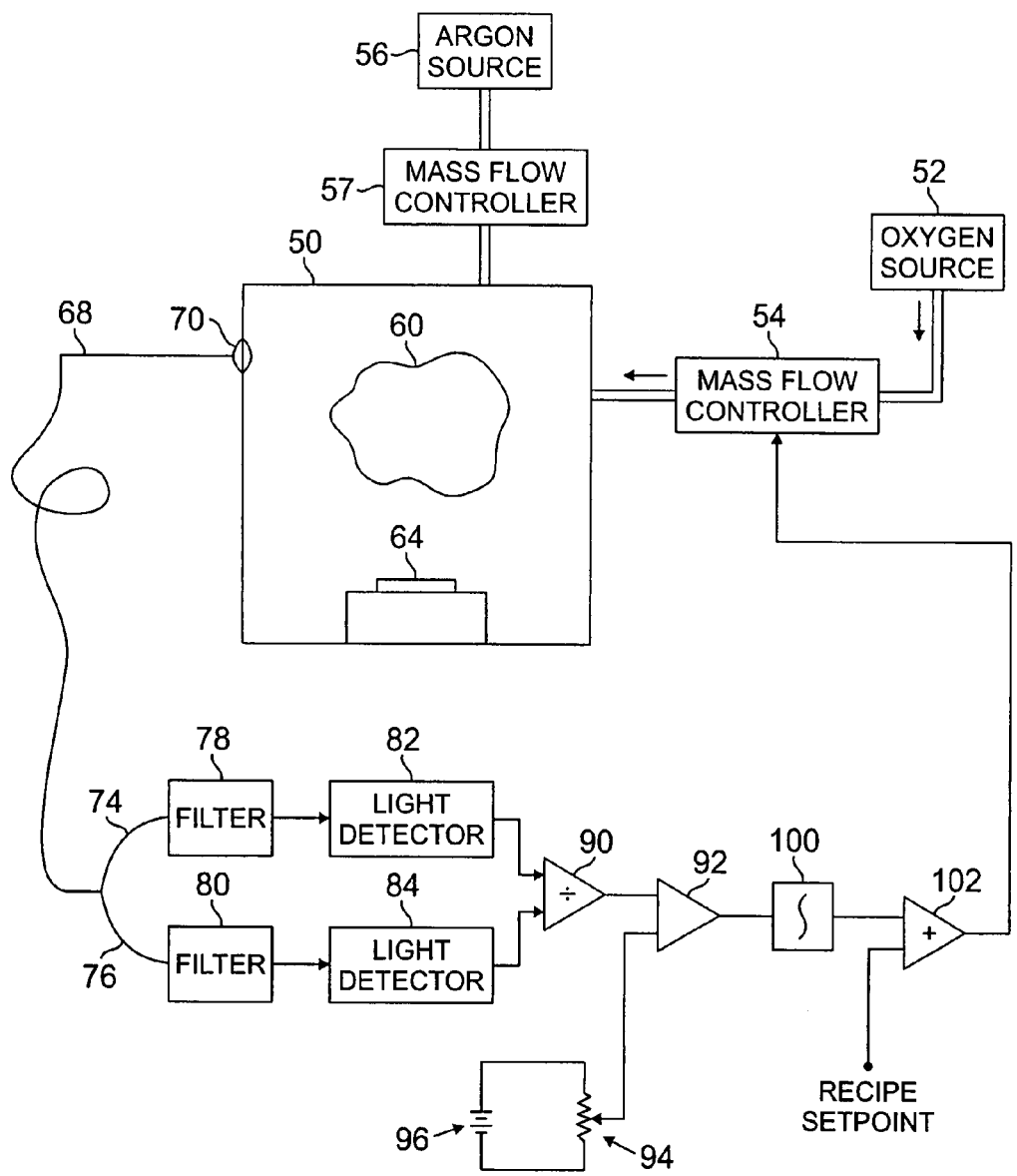
FIG. 3 is a schematic representation of an etching chamber, including control components thereof, constructed according to the teachings of the present invention.

FIG. 3 illustrates an etch chamber 50 receiving oxygen from an oxygen source 52 via a mass flow controller 54 for controlling the flow rate of the oxygen entering the etch chamber 50.

To perform the etch trim, one or more wafers 62 are loaded into the etch chamber 50 and a vacuum system (not shown) reduces the chamber pressure. After the vacuum is established, the mass flow controller 54 permits oxygen to flow from the oxygen source 52 into the etch chamber 50. According to the teachings of the present invention, argon is also introduced into the chamber at this time from an argon source 56 via a mass flow controller 57. Since argon is a non-reactive diluent gas, it can be added in known small quantities to the etch process without impacting the etch rate. Within the etch chamber 50 a power supply (not shown) creates a radio frequency field that energizes the oxygen-argon gas mixture to a plasma state (represented by a plasma 60) forming the oxygen radicals. The oxygen radicals attack and etch the photoresist, converting it to volatile components that are removed from the etch chamber 50 by the vacuum system.

To determine the oxygen radical concentration and thus the etch rate within the etch chamber 50, an optical fiber 68 collects light from the plasma 60 through an optical window 70 formed in a wall of the etch chamber 50. The optical fiber 68 bifurcates and each of two legs 74 and 76 is connected to an optical filter 78 and 80, respectively. The unique optical emission spectral lines of argon and oxygen are advantageous for determining their respective concentrations. Thus, one of the filters 78 and 80 is tuned to receive an oxygen spectral line while attenuating the remainder of the optical spectrum. The other of the filters 78 and 80 is similarly tuned to detect an argon spectral line. Typically, the filters 78 and 80 have a bandwidth of about 10 nanometers, wide enough to pass the energy in the desired spectral line while attenuating all other frequency components.

It is known that certain emission spectral lines for the oxygen and argon have a similar cross-sections for excitation. These lines are produced as the oxygen and argon atoms absorb similar amounts of energy during the plasma generation process, and the atoms react similarly to chamber conditions. The lines are selected so that the interference or absorption effects that arise from, for example deposited coatings on the chamber walls or on the optical window 70, produce a similar response (i.e., temporal changes in line intensity in response to the chamber conditions that will affect the etch rate) in both of the oxygen and argon emission lines. Exemplary lines include 750 nm for argon and 770 nm for oxygen. After the lines are chosen, the filters 78 and 80 are implemented to pass the selected lines and attenuate all others. Other inert gases having an emission line with a cross-section for excitation similar to oxygen are known and can be employed in lieu of argon.

Light detectors 82 and 84 respond to the filtered optical signals, where the light detector 82 produces a signal representative of the oxygen concentration, and the light detector 84 produces a signal representative of the argon concentration.

In a ratio or dividing element 90, the signal representing the oxygen emission is divided by the signal representing the argon emission. This division process normalizes the oxygen concentration, by removing small variations in global effects present in the etch chamber 50 that affect both the oxygen and argon concentrations. Thus the output signal from the dividing element 90 represents the oxygen concentration in the etch chamber 50 after removal of those artifact conditions that can lead to inaccurate concentration determinations.

The intensity of both the argon and the oxygen spectral lines are proportional to various chamber conditions, the number of electrons in the plasma, the electron energy, and the density of the argon and oxygen atoms in the chamber 50. That is, the spectral line intensity increases in proportion to the number of collisions between the argon and the oxygen atoms and the plasma electrons. As the density of the electrons and/or the density of the argon and oxygen atoms increases more collisions occur. With knowledge of the pressure, temperature and volume of the chamber 50, and the flow conditions from the mass flow controller 57, the number of argon molecules in the chamber can be determined. The process of dividing the signals representing the intensity of the argon and the oxygen atoms as set forth above effectively produces a signal representative of the number of oxygen atoms (or the concentration thereof) in the chamber 50. An excess concentration of oxygen atoms results in an over-trim condition and too few atoms does not sufficiently trim the photoresist.

Thus the output signal from the dividing element 90, representing the real-time gas concentration, is provided as an input to a first terminal of a comparator 92 (preferably an operational amplifier operating in a comparator mode). A second input terminal of the comparator 92 is responsive to a gas concentration reference value for comparison with the real-time concentration value. Thus the reference value is empirically predetermined to be substantially equal to the output signal from the dividing element 90 when the oxygen concentration in the etch chamber 50 is optimum for the etch trimming process. That is, the oxygen properly trims the dimensions of the photoresist. In the FIG. 3 embodiment the reference value is established by a voltage divider circuit comprising an adjustable resistor 94 and a direct current voltage source 96. Those skilled in the art recognize that there are other techniques for producing the reference value. The comparator output signal is an error signal indicating the amount by which the oxygen concentration varies from the optimum value.

To avoid controlling the chamber oxygen concentration in response to short term transients, the comparator error signal is provided as an input to an integrator 100 for integrating the error signal over time, thus smoothing the signal by removing short duration concentration variations. The integrated error signal is input to a first terminal of an adder 102 (preferably an operational amplifier operating in an adder mode). A second terminal of the adder 102 is responsive to a "recipe" set point value representative of the nominal control voltage applied to the mass flow controller 54 for controlling the oxygen concentration. The integrated error signal is added or subtracted from the recipe set point in the adder 102, modifying the control signal applied to the mass flow controller 54, which in turn responds by changing the oxygen flow rate from the oxygen source 52 into the etch chamber 50. Thus by establishing a feedback mechanism that measures the oxygen concentration and controls the mass flow controller in response to the concentration a consistent trim etch rate is provided.

Another application for the teachings of the present invention provides for the monitoring of a third gas species in an etch process using a trifurcated optical fiber and a corresponding number of filters and light detectors. In plasma etching processes, the primary etchant is ion driven and thus provides a substantially isotropic etch. However, it is known that non-ion driven chemical etching, which is anisotropic, also occurs in the plasma etch chamber. To minimize the undesirable lateral etching, a passivating species is introduced into the etch chamber for depositing a polymeric-like material on the sidewalls, to prevent the lateral etching. Fluorocarbons are such known passivating materials. The ratio between the etchant and the passivating materials must be carefully controlled. If the passivating material concentration is too high, the material will also form on the horizontal surfaces and thus impede the isotropic etching. The teachings of the present invention can be applied to control a mass flow controller associated with both the etching material and the passivating material by determining the actual material concentrations and comparing those to a reference concentration.

The teachings of the present invention can also be applied to the precision in situ control of critical gaseous precursors in other processes, including plasma etch, plasma deposition, and gas-phase processes. As an example, the concentration of dichlorosilane gas used in the selective growth of epitaxial silicon-germanium can be monitored according to the teachings of the present invention in conjunction with a small plasma source that samples the reaction gasses or the effluent. Thus the spectroscopic techniques of the present invention are of general utility since they can be used to detect extremely small gas concentrations.

A process and apparatus have been described as useful for controlling the etch trim rate of a feature on a semiconductor substrate. While specific applications and examples of the invention have been illustrated and discussed, the principles disclosed herein provide a basis for practicing the invention in a variety of ways. Numerous variations are possible within the scope of the invention, which is limited only by the claims that follow.

What is claimed is:

1. A process for controlling etching on a semiconductor substrate wherein the etching is affected by the concentration of an etchant gas, and wherein the etchant gas is input to an etch chamber via a mass flow controller, the process comprising:
    determining a desired etchant gas concentration;
    supplying an inert gas to the etch chamber;
    producing a first signal representative of an actual etchant gas concentration;
    producing a second signal representative of an inert gas concentration;
    relating the first and the second signals to produce a normalized etchant gas concentration signal;
    employing a comparator having a first input terminal receiving the normalized etchant gas concentration signal and a second input terminal receiving a reference signal representing the desired etchant gas concentration, the comparator for outputting an error signal for controlling the mass flow controller, said error signal representing a difference between said reference signal and said normalized etchant gas concentration signal; and
    controlling the mass flow controller in response to the employing step.

2. The process of claim 1 wherein the etchant gas comprises an oxygen radical.

3. The process of claim 1 wherein the inert gas comprises argon.

4. The process of claim 1 wherein the etchant gas comprises an oxygen radical, the process further comprising:
    supplying oxygen to the etch chamber; and
    forming a plasma within the etch chamber to form an oxygen radical from the oxygen.

5. The process of claim 1 wherein the first signal comprises a signal representative of a spectral emission line formed by the etchant gas.

6. The process of claim 1 wherein the second signal comprises a signal representative of a spectral emission line formed by the inert gas.

7. The process of claim 1 wherein the step of relating further comprises dividing the first signal by the second signal.

8. The process of claim 1 wherein the semiconductor substrate comprises a plurality of transistor gate features formed with predetermined dimensions, and wherein the etchant gas reduces certain feature dimensions.

9. The process of claim 1 wherein the step of relating comprises:
    filtering the first signal to produce a filtered first signal representative of a spectral emission line formed by the etchant gas;
    filtering the second signal to produce a filtered second signal representative of a spectral emission line formed by the inert gas; and
    relating the first and the second filtered signals to produce the normalized etch gas concentration signal.

10. The process of claim 9 wherein the step of relating further comprises filtering the normalized etchant gas signal to remove short duration temporal variations.

11. The process of claim 10 wherein the step of filtering further comprises integrating the normalized etchant gas signal.

12. The process of claim 1 wherein the first and the second signals comprise first and second optical signals, respectively.

13. The process of claim 12 further comprising filtering the first optical signal to produce a filtered first optical signal and transforming the filtered first optical signal to a first electrical signal, wherein the first electrical signal represents the actual etchant gas concentration.

14. The process of claim 12 further comprising filtering the second optical signal to produce a filtered second optical signal and transforming the filtered second optical signal to a second electrical signal, wherein the second electrical signal represents the inert gas concentration.

15. A process for controlling isotropic etching on a semiconductor substrate wherein the isotropic etching is affected by a concentration of an etchant gas input to an etch chamber via a mass flow controller, and wherein anisotropic etching also occurs in the etch chamber, the process comprising:
    determining a desired etchant gas concentration;
    supplying a passivating gas to the etch chamber;
    producing a first signal representative of an actual etchant gas concentration;
    producing a second signal representative of a passivating gas concentration;
    relating the first and the second signals to produce a third signal;
    employing a comparator having a first input terminal receiving the first signal and a second input terminal receiving a reference signal representing the desired etchant gas concentration, the comparator for outputting an error signal for controlling the mass flow controller, said error signal representing a difference between said reference signal and said first signal; and controlling the concentration of at least one of the etchant gas and the passivating gas in response to the employing step.

16. The process of claim 15 wherein the third signal represents a ratio of the etchant gas and the passivating gas.

17. The process of claim 15 wherein the first signal comprises a signal representative of a spectral emission line formed by the etchant gas.

18. The process of claim 15 wherein the second signal comprises a signal representative of a spectral emission line formed by the passivating gas.

19. The process of claim 15 wherein the reference relates to the ratio of the passivating gas to the etchant gas to limit an extent of the anisotropic etch.

20. A process for controlling an etch rate on a semiconductor substrate wherein the etch rate is substantially affected by the concentration of an etchant gas, and wherein the etchant gas is input to an etch chamber via a mass flow controller, the process comprising:

determining the etchant gas concentration in the etch chamber;

employing a comparator having a first input terminal receiving a first signal representative of the etchant gas concentration and a second input terminal receiving a reference signal representing a desired etchant gas concentration, the comparator for outputting an error signal for controlling a mass flow controller controlling a flow rate of said etchant gas, said error signal representing a difference between said reference signal and said normalized etchant gas concentration signal;

generating an error signal in response to the employing step; and controlling the mass flow controller in response to the error signal.

* * * * *